(12) United States Patent
Ueno

(10) Patent No.: US 8,039,879 B2
(45) Date of Patent: Oct. 18, 2011

(54) SEMICONDUCTOR DEVICE HAVING A CONTROL CIRCUIT AND METHOD OF ITS MANUFACTURE

(75) Inventor: Katsunori Ueno, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 182 days.

(21) Appl. No.: 12/257,125

(22) Filed: Oct. 23, 2008

(65) Prior Publication Data

US 2009/0114946 A1    May 7, 2009

(30) Foreign Application Priority Data

Oct. 24, 2007 (JP) .................... 2007-276453

(51) Int. Cl.
*H01L 27/06* (2006.01)
(52) U.S. Cl. . 257/273; 257/394; 257/551; 257/E29.198; 257/E27.02
(58) Field of Classification Search .......... 257/265, 257/273, 378, 394, 546, 547, 551, 552, 577, 257/E29.198, E27.017, E27.02
See application file for complete search history.

(56) References Cited

U.S. PATENT DOCUMENTS

| 4,689,647 | A | | 8/1987 | Nakagawa et al. | |
|---|---|---|---|---|---|
| 5,360,984 | A | | 11/1994 | Kirihata | |
| 5,798,538 | A | * | 8/1998 | Nadd et al. | 257/139 |
| 6,448,587 | B1 | * | 9/2002 | Kohno et al. | 257/133 |
| 6,495,866 | B2 | * | 12/2002 | Kawamoto | 257/175 |
| 6,677,182 | B2 | * | 1/2004 | Carlson | 438/113 |
| 7,135,387 | B2 | * | 11/2006 | Nakazawa et al. | 438/473 |

FOREIGN PATENT DOCUMENTS

| JP | 61-15370 A | 1/1986 |
|---|---|---|
| JP | 63-209177 A | 8/1988 |
| JP | 2-309676 A | 12/1990 |
| JP | 5-152574 A | 6/1993 |
| JP | 2959127 B2 | 7/1999 |
| JP | 2007-165424 A | 6/2007 |
| WO | 91/03842 A1 | 3/1991 |

* cited by examiner

*Primary Examiner* — Benjamin Sandvik
*Assistant Examiner* — Wensing Kuo
(74) *Attorney, Agent, or Firm* — Rossi, Kimms & McDowell LLP

(57) ABSTRACT

A semiconductor has an IGBT active section and a control circuit section for detecting an IGBT abnormal state. A collector region is formed on the back surface side (i.e., on the IGBT collector side) in a selective manner, namely right under the IGBT active section.

17 Claims, 11 Drawing Sheets

SEMICONDUCTOR DEVICE HAVING A CONTROL CIRCUIT AND METHOD OF ITS MANUFACTURE

BACKGROUND

Referring to FIG. 8, a known igniter for an internal combustion engine includes inductive loads (secondary coil 42 and primary coil 45). The igniter uses intermittent sparks that occur in an ignition plug 44 connected to the secondary coil 42 due to high voltages generated across the secondary coil 42 when intermittent currents flow through the primary coil 45 from a power source 41. In this type of igniter, a bipolar transistor has been used as a switching means 43 in the circuit for intermittently flowing current through the primary coil 42. In recent years, however, an insulated-gate bipolar transistor (IGBT) has replaced the bipolar transistor.

A low on-voltage and a low switching loss are important electrical characteristics that the IGBT can satisfy, thus making it suitable for the switching means 43 of the above igniter. To attain a low on-voltage, a punchthrough IGBT having a thin epitaxial layer (n-type drift layer) 26 (see FIG. 7) has been used as the IGBT suitable for the above igniter. Presently, a non-punchthrough (hereinafter abbreviated as NPT) IGBT using an FZ substrate and a field-stop (buffer layer) IGBT, which is expected to attain further improvements in characteristics, are being studied, taking the above electrical characteristics into consideration. The field-stop (hereinafter may be abbreviated as FS) IGBT as mentioned above is a type of punchthrough IGBT. As shown in FIG. 7, which is a sectional view showing the relevant elements, an ordinary punchthrough IGBT is configured so that a semiconductor functional structure, such as a MOS gate structure, is formed in an epitaxial layer 26, which is formed on a low-resistivity semiconductor substrate 25. Requiring the epitaxial layer 26 in the ordinary punchthrough IGBT, however, is costly.

Referring to FIG. 7, a known configuration incorporates a circuit 21 for monitoring the operation status and controlling a gate signal when an abnormality occurs to prevent the IGBT from being destroyed due to overcurrent, overvoltage, or overheating. In the circuit 21, an n-channel MOSFET, formed in a p-well region 9 and whose drain 10-1 is connected to an emitter electrode 3-1 of the IGBT, serves as a main transistor.

In the IGBT incorporating the circuit 21, while the IGBT is ON (i.e., conductive state), holes flow from a collector 1 toward p-well regions 6 (formed on the front surface side) as indicated by an arrow 33 in FIG. 10. This hole current not only serves as a main current of the IGBT, but also flows into the p-type region 9, which is part of the circuit section 21. The hole current (indicated by an arrow 34 in FIG. 10) flowing into the circuit section 21 can cause a parasitic transistor existing in the circuit section 21 to operate. To suppress that, a p-type region (contact p-type region) 8 is formed between the IGBT active section 20 and the circuit section 21 and is short-circuited with the emitter electrode 3-1 through a contact having a large area. A large part of the current flowing into the p-type region 9 is thus diverted to the emitter electrode 3-1, so that only a small amount of current flows into the circuit section 21.

In the L-load igniter circuit, however, when the IGBT transitions from the ON state to the OFF state, the current decreases rapidly so that a rapidly increasing voltage develops across the primary coil 45 in a direction that counters rapid decrease of current i flowing through it, which is represented by L×di/dt (the positive side is the collector side of the IGBT), where L is the inductance of the primary coil 45. When an OFF state has been established, the voltage decreases rapidly. This surge voltage (hundreds of volts) is clamped by a Zener voltage of Zener diodes 16 connected between the collector and gate of the IGBT, with its anode located on the gate side, whereupon a reverse voltage is induced across the secondary coil 42. In the above process, the positive surge voltage on the primary side can turn to a negative voltage (tens of volts to 100 V) as it lowers. If a negative voltage occurs on the primary side, a reverse bias is applied to the collector 1 of the IGBT, in which case the IGBT can be damaged.

This type of IGBT destruction will be described below with reference to FIG. 9. When a negative bias 30 is applied to the collector 1, a pn junction 19 between a collector region 25 and a buffer layer 24 of the IGBT is biased reversely, whereas a pn junction 17 between a drift layer 26 and the p-well regions 6 located on the front surface side of the IGBT is forward-biased. Therefore, when the collector 1 is biased negatively, the breakdown voltage is determined by the pn junction 19. The pn junction 19 is in the form of a flat plane, but the end of the pn junction 19 is exposed in a circumferential cutting face of the chip. Since the chip-shaped IGBTs are cut out mechanically in lattice form from a large-diameter wafer, the peripheral cutting face of each chip can contain many crystal defects (damage). Therefore, in a peripheral cutting face 32 of the collector-side pn junction 19, the reverse breakdown voltage varies widely depending on the position, and a local region where the breakdown voltage is very low can exist. When a negative bias surge is applied, a large current is concentrated in the low-breakdown-voltage local region, making the device prone to damage.

On the other hand, as described above, the punchthrough IGBT is costly because it requires an epitaxial layer. In contrast, using an inexpensive FZ n-type substrate, the NPT-type IGBT, and the FS-type IGBT can be manufactured at a lower cost and can exhibit a low ON-voltage. In this respect, their use as an IGBT of an igniter for an internal combustion engine is being studied.

The above-described problem occurs when a negative bias surge is applied, which makes the device prone to damage because a large current can be concentrated in a low-breakdown-voltage local region, which is particularly vulnerable in the NPT-IGBT and the FS-IGBT. This is because in the NPT-IGBT and the FS-IGBT, the collector region is a very thin layer of about 1 μm and the end of the pn junction 19 is close to the side end of the back surface where chipping most likely would occur. A reverse blocking IGBT, which solves this problem, is known. Here, the end of the pn junction is not exposed in chip cutting faces so that sufficient breakdown resistance to a negative collector voltage is secured. See JP-A-2007-165424.

A reverse conducting IGBT, which employs another method, has been invented. Here, an n-type region, which is given the same potential as the collector, is formed on the front surface side of an IGBT chip and connected to the collector by a bonding wire. See U.S. Pat. No. 5,519,245 (Japanese Patent No. 2,959,127). Many types of reverse conducting IGBTs incorporating a fly-wheeling diode (FWD) have been proposed. See for example, U.S. Pat. No. 4,689,647 (JP-A-61-15370), JP-A-63-209177, JP-A-2-309676, and U.S. Pat. No. 5,360,984 (JP-A-5-152574).

In the reverse blocking IGBT disclosed in JP-A-2007-165424, however, it is necessary to form a deep p-type diffusion region of 100 μm or more. Furthermore, it is also necessary to secure, near the periphery of an IGBT chip, a wide region needed to form the deep diffusion region. These require a very long heat treatment process, for example, which results in very low throughput (production efficiency).

Furthermore, high-temperature, long-time heat treatment causes various problems, such as introducing many crystal defects into the silicon semiconductor and lowering the yield to a large extent.

U.S. Pat. No. 5,519,245 is not directed to a measure against a negative collector voltage discussed above, but relates to a technique in which an FWD, which is usually attached externally, is incorporated in an IGBT used in an L-load drive circuit, such as an inverter. In the structure disclosed in U.S. Pat. No. 5,519,245, since a metal electrode given the same potential as the collector is in ohmic contact with the n-type region formed in a peripheral portion adjacent to the emitter-side (positive-potential side) surface, even if a negative collector bias is applied, a large current flows through a p-well region in contact with an emitter electrode. Therefore, almost no voltage drop occurs, the degree of heat generation is low, and no current concentration occurs. It is necessary, however, to form a large-area n-type region in a peripheral portion on the front surface side (emitter side) of a semiconductor chip. This increases the chip size. The reverse conducting IGBTs disclosed in U.S. Pat. No. 4,689,647, JP-A-63-209177, JP-A-2-309676, and U.S. Pat. No. 5,360,984 have similar problems.

Furthermore, as described above, to prevent an abnormal latch-up operation when the IGBT incorporating the circuit section 21 (see FIG. 10) is ON, it is necessary to form a large contact region between the IGBT active section 20 and the circuit section 21. This increases the chip size of the IGBT.

Accordingly, there remains a need for a semiconductor device that avoids the above-mentioned problems. The present invention addresses this need.

SUMMARY OF THE INVENTION

The present invention relates to a semiconductor device usable in a circuit including an inductive load (L load), and its manufacturing method. More particularly, the present invention relates to an IGBT having a control circuit suitable in an igniter for an internal combustion engine and its manufacturing method.

One aspect of the present invention is a semiconductor device. The device includes a semiconductor substrate of a first-conductivity type having a one major surface and an opposite major surface opposite the one major surface. The device has an IGBT section that includes an active section on a side of the one major surface of the semiconductor substrate, including a gate electrode and an emitter electrode, a breakdown-resistant structure surrounding the active section, a collector region of a second-conductivity type on a side of the opposite major surface of the semiconductor substrate, and a collector electrode in contact with the opposite major surface of the semiconductor substrate. The collector region is in the opposite major surface of the semiconductor substrate positioned underneath the active section. The collector region can also extend underneath the breakdown-resistant structure.

The device can include a first high-concentration region of the first-conductivity type in the one major surface of the semiconductor substrate, outside the breakdown-resistant structure, and higher in impurity concentration than the semiconductor substrate. A Zener diode or diodes can be connected to the high-concentration region and the gate electrode, with an anode side of the Zener diode connected to the gate electrode.

The device can include a control circuit section disposed inside the breakdown-resistant structure on the side of the one major surface of the semiconductor substrate, and a well region of the second-conductivity type in the one major surface of the semiconductor substrate and surrounding the control circuit section. The well region connects to the emitter electrode of the IGBT section. The control circuit protects the IGBT section by detecting an abnormal state of the IGBT section through the emitter electrode and controls the gate voltage of the IGBT section.

The device can include a buffer region of the first-conductivity type positioned between the collector region and the active region, and having a higher impurity concentration than the semiconductor substrate.

The device can include second high-concentration region of the first-conductivity type adjacent to the collector region and having a higher impurity concentration than the semiconductor substrate.

The device can include an intermediate-concentration layer of the first-conductivity type on the side of the opposite major surface extending deeper into the opposite major surface than the collector region and the second high-concentration region, wherein the intermediate-concentration layer has impurity concentration between those of the semiconductor substrate and the second high-concentration region.

The second high-concentration region can be positioned underneath the control circuit section. A third high-concentration region of the first-conductivity type can be positioned adjacent to the collector region and positioned underneath the breakdown-resistant structure.

The active section can include a base region of the second-conductivity type in the one major surface of the semiconductor substrate, an emitter region of the first-conductivity type in a surface region of the base region, with the emitter electrode in contact with both the emitter region and the base region, and with the gate electrode over a portion of the base region located between the emitter region and a portion of one major surface of the semiconductor substrate adjacent to the base region, with a gate insulating film interposed in between, The depth of the collector region can be about 1 μm. The thickness of the semiconductor substrate can range inclusive between 70-120 μm. The semiconductor substrate can be an FZ or CZ substrate.

Another aspect of the present invention is a method of manufacturing the semiconductor device mentioned above. The method can include providing the semiconductor substrate, forming the IGBT device structure, the first high-concentration region, the control circuit section, and the well region all on the side of the one major surface of the semiconductor substrate. Thereafter, the method includes reducing the thickness, such as by grinding, of the semiconductor substrate from the opposite major surface to a predetermined thickness depending on the desired breakdown voltage. Thereafter, the method includes implanting an impurity of the second-conductivity type to a region positioned underneath the active section in the opposite major surface of the semiconductor substrate. Thereafter, the implanted region is annealed to form the collector region in the opposite major surface of the semiconductor substrate. The collector electrode in contact with the opposite major surface of the semiconductor substrate is thereafter formed. The Zener diode for clamping an overvoltage applied between the collector electrode and the gate electrode of the IGBT device is connected to the first high-concentration region and the gate electrode, with the anode side of the Zener diode connected to the gate electrode of the IGBT device. The well region connects to the emitter electrode of the IGBT device. The control circuit protects the IGBT device by detecting an abnormal state of the IGBT device through the emitter electrode and controls the gate voltage of the IGBT device.

DETAILED DESCRIPTION

IGBTs according to embodiments of the present invention will be hereinafter described in detail with reference to the drawings. In the following description of the embodiments and the accompanying drawings, the same layers, regions, etc. will be given the same reference symbol to avoid redundant descriptions.

Figure 1:
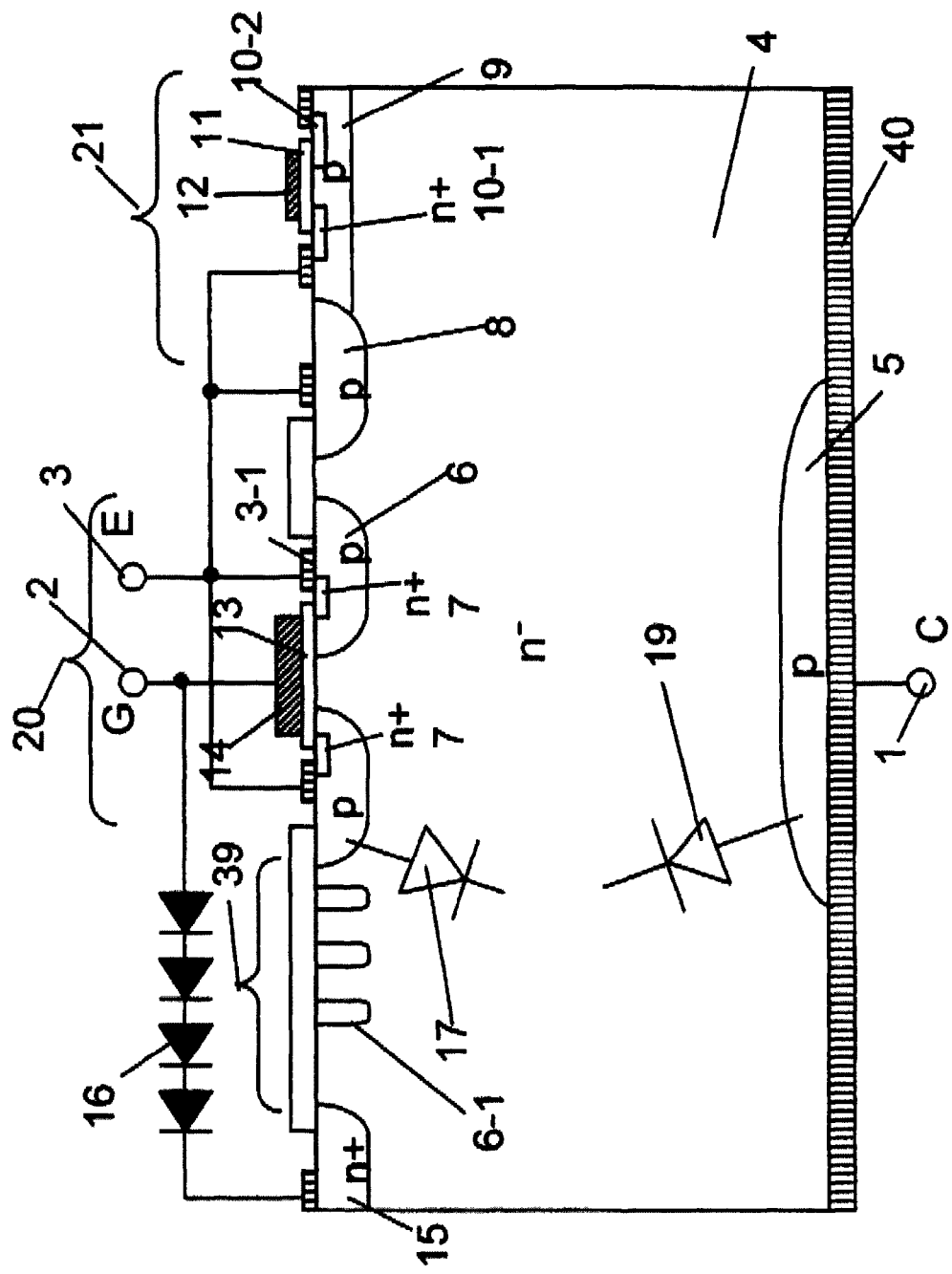
FIG. 1 schematically illustrates a sectional view of a first embodiment of an IGBT according to the present invention, showing relevant elements thereof.

Referring to FIG. 1, the first embodiment includes an IGBT active section 20, which is formed on the side of one major surface (front surface) of an FZ n-type semiconductor substrate 4, having a well known structure, including p-well regions 6 (which can be connected to each other), $n^+$ emitter regions 7 formed (as surface regions) in the surface of the respective p-well regions 6, a gate insulating film 13 formed on portions of the p-well regions 6 located between the $n^+$ emitter regions 7 and the portion, adjacent to the surface, of the semiconductor substrate (drift layer) 4, and a gate electrode 14 on the gate insulating film 13.

Each contact of an emitter electrode 3-1 is in contact with both the associated $n^+$ emitter region 7 and the p-well region 6, and the opposite major surface (back surface) of the semiconductor substrate (drift layer) 4 is covered with a collector electrode 40. A breakdown-resistant structure 39 including guard rings 6-1 and a high-concentration $n^+$ region 15 (which is a surface region) formed in the surface of the semiconductor substrate 4 and located outside the breakdown-resistant structure 39 surrounding the IGBT active section 20. An IGBT chip is cut out by cutting the wafer at the high-concentration $n^+$ region 15. The right-hand end line of FIG. 1 is not a cutting end of an IGBT chip but is an arbitrary position in the IGBT illustrated for convenience. This also applies to other sectional views referred here.

The inside region surrounded by the breakdown-resistant structure 39 has, in addition to the IGBT active section 20, a circuit section 21 and a contact p-type region 8 surrounding the circuit section 21 and contacting a p-well region 9 of the circuit section 21. The emitter electrode 3-1 is connected electrically to the contact p-region 8. The circuit section 21 has an n-channel MOSFET in which an $n^+$ drain region 10-1 and an $n^+$ source region 10-2 are formed (as surface regions) in the surface of the p-well region 9, and a gate electrode 12 is on the portion of the p-well region 9 located between the drain region 10-1 and the source region 10-2, with a gate insulating film 11 interposed in between. The $n^+$ drain region 10-1 is connected to the emitter electrode 3-1. As described above, to prevent destruction of the IGBT due to overcurrent, overvoltage, or overheating, the circuit section 21 monitors the operation status and controls the gate signal in the event of abnormality.

In the first embodiment, a p-type region 5 (collector region) is formed on the back surface side right under the IGBT active section 20. In the other area of the back surface side, the back surface of the drift layer (semiconductor substrate) 4 is in direct contact with the collector electrode 40 (i.e., forming a Schottky junction). It is preferable to use, as a metal material of the first layer, in particular, of the collector electrode 40, Ti or similar material that provides a low Schottky barrier height when joined to an n-type silicon substrate.

With the above configuration, when a negative collector surge is applied between the collector 1 and the emitter 3, reverse-direction main current can flow by virtue of a low breakdown voltage of the Schottky junction, so that current concentration can be suppressed and hence the degree of heat generation can be lowered. While the IGBT is conductive, since hole current flows only from the p-type region 5, only a very small part of the hole current reaches the circuit section 21. Therefore, the distance between the circuit section 21 and the IGBT active section 20 can be shortened in relation to a conventional value of hundreds of micrometers to 100 μm or less, making it possible to reduce the chip size.

Figure 11:
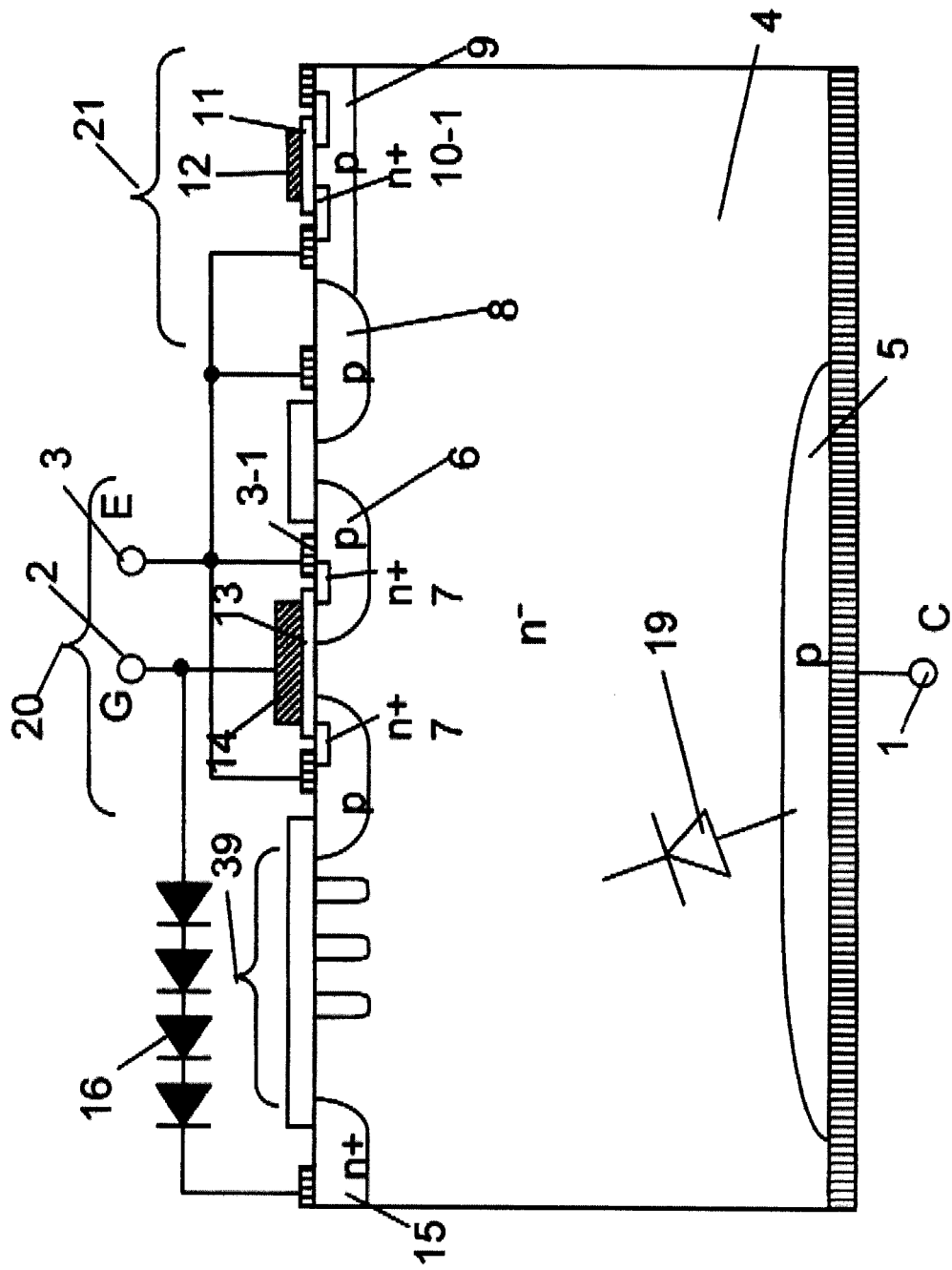
FIG. 11 schematically illustrates a sectional view of a modified IGBT of FIG. 1.

The above description is directed to the IGBT where, as shown in FIG. 1, the collector region 5 is formed in the back surface side, positioned in a region to be opposed to (i.e., underneath) the IGBT active section 20. Alternatively, as shown in FIG. 11, the collector region 5 can be extended to the region underneath the breakdown-resistant structure 39 surrounding the IGBT active section 20.

Figure 5:
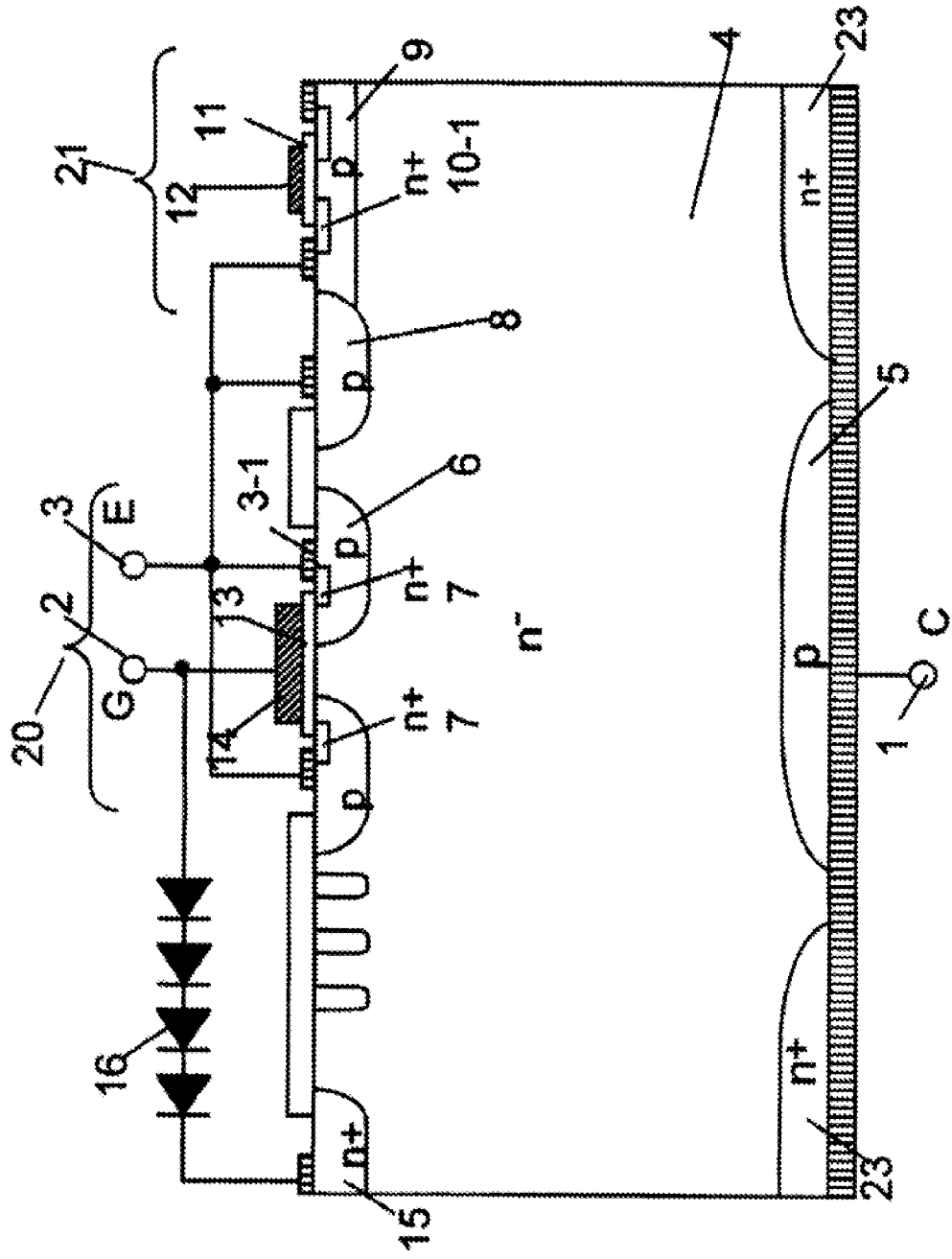
FIG. 5 schematically illustrates a sectional view of a fourth embodiment of an IGBT according to the present invention, showing relevant elements thereof.
Figure 6:
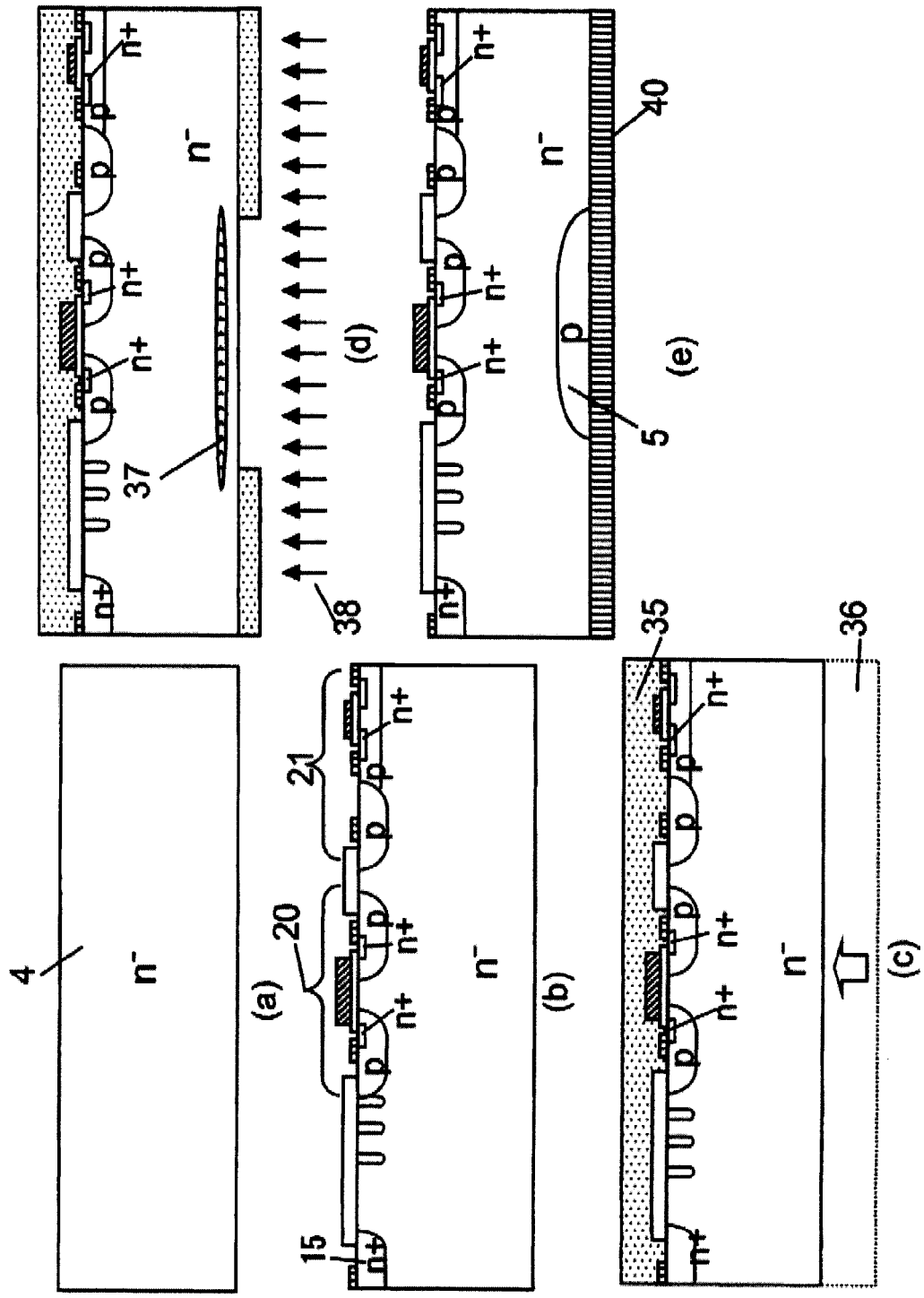
FIGS. 6A-6E schematically illustrate sectional views of showing the manufacturing process of the IGBT of FIG. 1.
Figure 7:
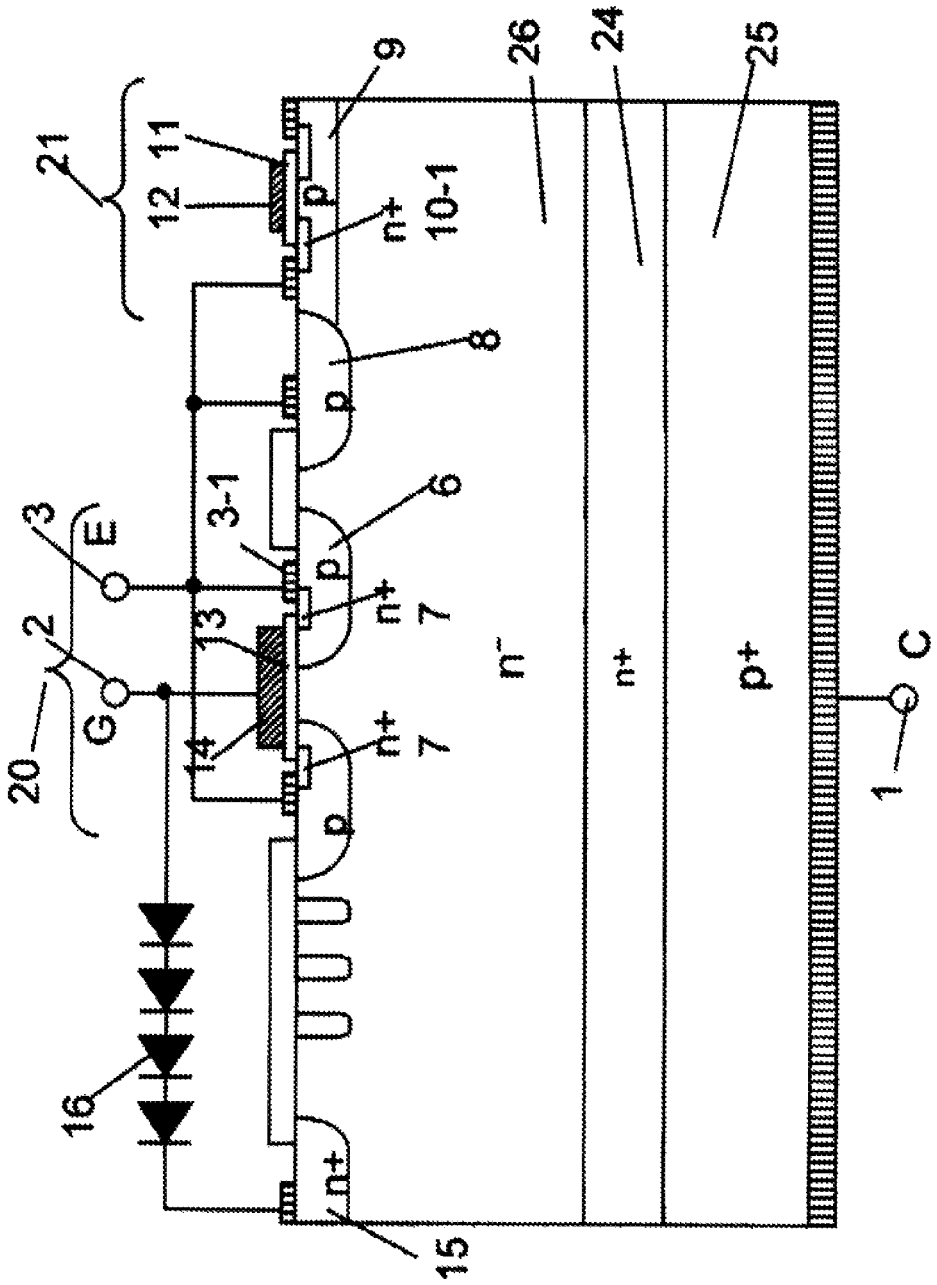
FIG. 7 schematically illustrates a sectional view of a conventional IGBT for an igniter, showing relevant elements thereof.
Figure 8:
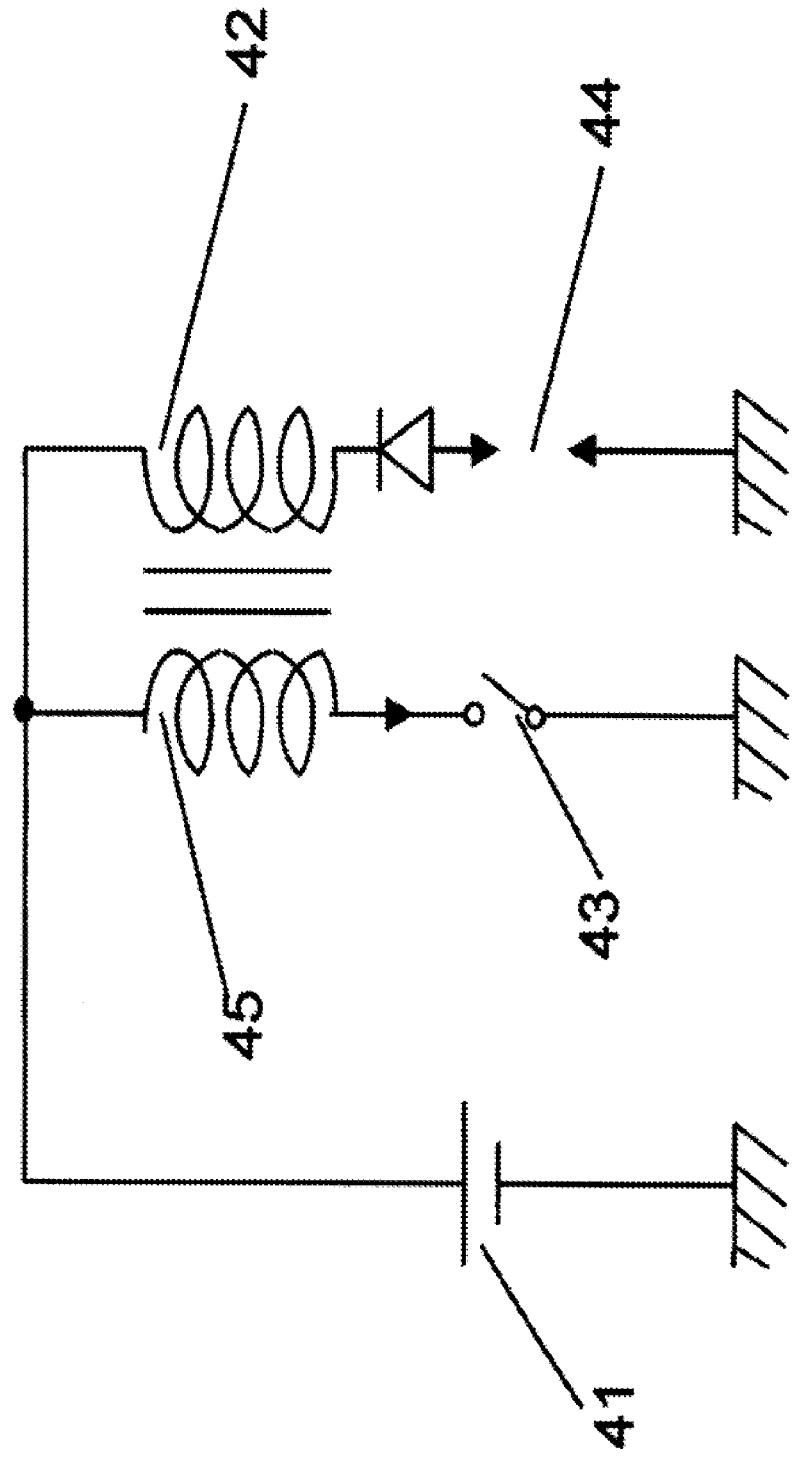
FIG. 8 schematically illustrates a basic circuit diagram of an igniter.
Figure 9:
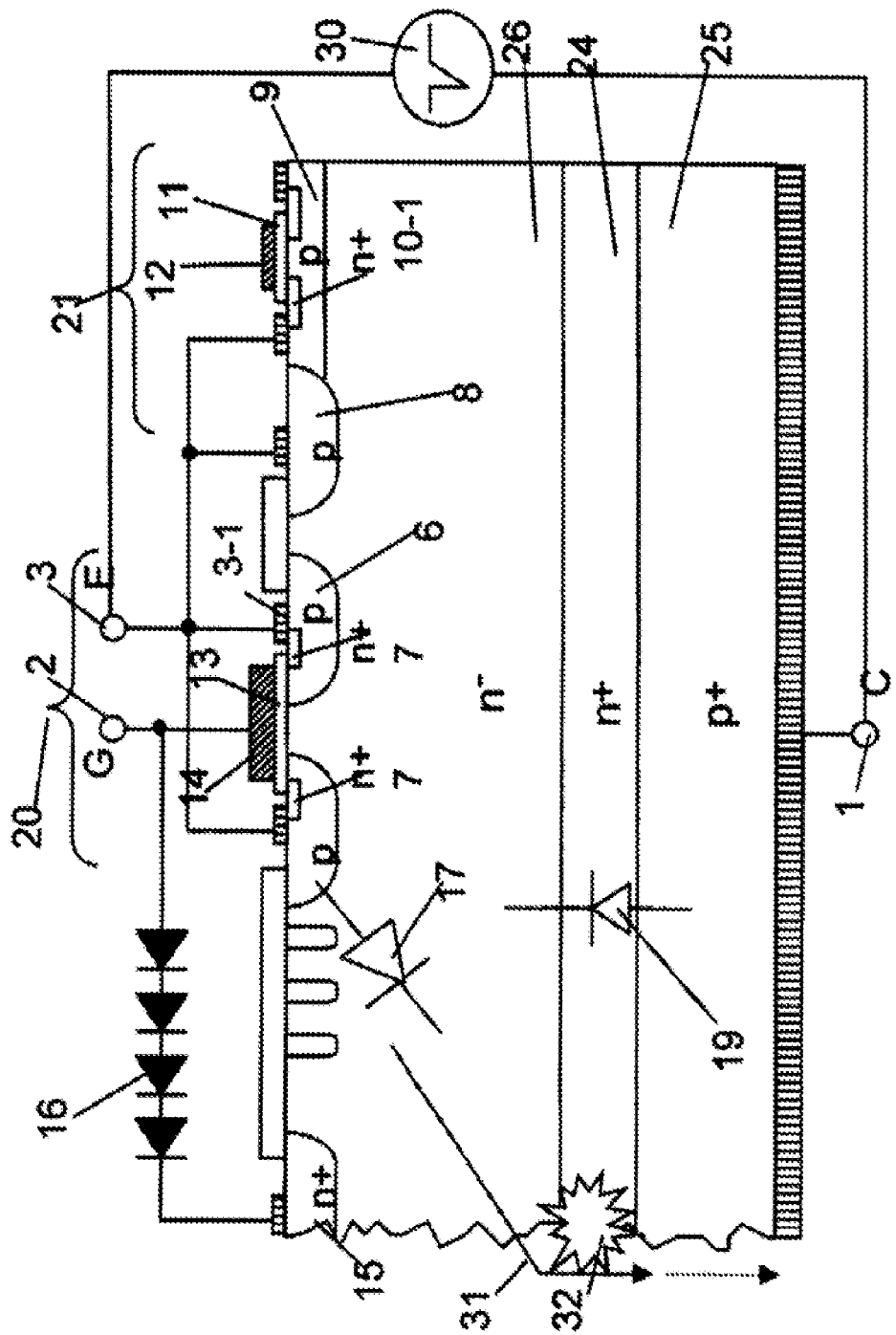
FIG. 9 schematically illustrates a sectional view of the conventional IGBT of FIG. 7, illustrating how a negative collector surge can destroy the IGBT.
Figure 10:
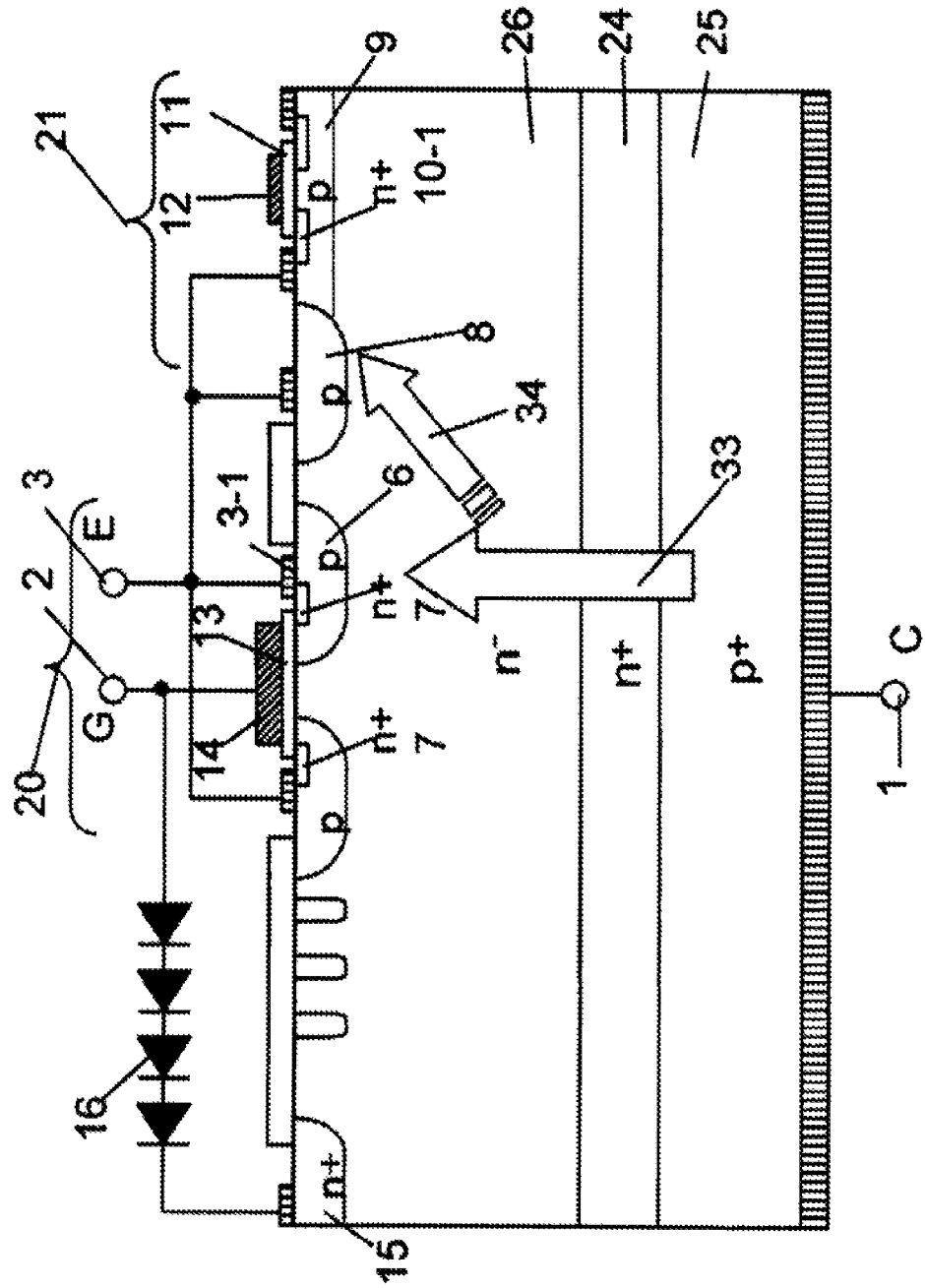
FIG. 10 schematically illustrates a sectional view of the conventional IGBT of FIG. 7, illustrating how an on-time hole current influences a control circuit section.

Referring to FIGS. 6A-6E, the manufacturing process of the IGBT for an igniter circuit of FIG. 1 includes providing (FIG. 6A) an FZ substrate, a CZ substrate, or the like, which is a high-resistivity substrate (resistivity: 20 to 50 Ω·cm) rather than a conventional semiconductor substrate formed by depositing an epitaxial layer. Then, a surface MOS device structure is formed (FIG. 6B) by a process that is similar to the corresponding part of an ordinary IGBT manufacturing process, except for the patterns of the circuit section 21 and the outermost high-concentration $n^+$ region 15. Then, after protecting the front surface side of the semiconductor substrate with a protective film 35 (FIG. 6C), the back surface side is ground (a portion indicated by a broken line 36 is ground away) to obtain a thickness (70 to 120 μm) determined by the desired breakdown voltage. Then, a resist film is formed on the back surface and an opening is formed through it by photolithography and a p-type impurity 37, such as boron is introduced by ion implantation 38 or the like (FIG. 6D). Where a high-concentration $n^+$ region 23 is formed, as in the third to fifth embodiments (FIGS. 3-5), another opening is formed likewise by photolithography and an impurity such as phosphorus or arsenic is introduced. When the impurity is introduced over the entire wafer, it is not necessary to perform photolithography.

Subsequently, the collector region 5 is formed by thermally activating the introduced impurity with a heat treatment at about 400° C. At this temperature, the introduced impurity cannot be fully activated. To increase the concentration further, a laser annealing apparatus can be used, in which case almost 100% activation can be attained. Finally, the collector electrode 40, which can be a Ti/Ni/Au lamination metal film, for example, is formed on the back surface (FIG. 6E) to complete the IGBT device. The metal film contacting the back-side semiconductor surface can be Ti or Al, which is apt to attain good contact with an n-type region. Furthermore, Zener diodes 16 for clamping an overvoltage to be applied between the collector 1 and the gate 2 are connected between the gate 2 and the high-concentration $n^+$ region 15. The Zener diodes 16 can be attached either externally or incorporated in an IGBT chip.

Figure 2:
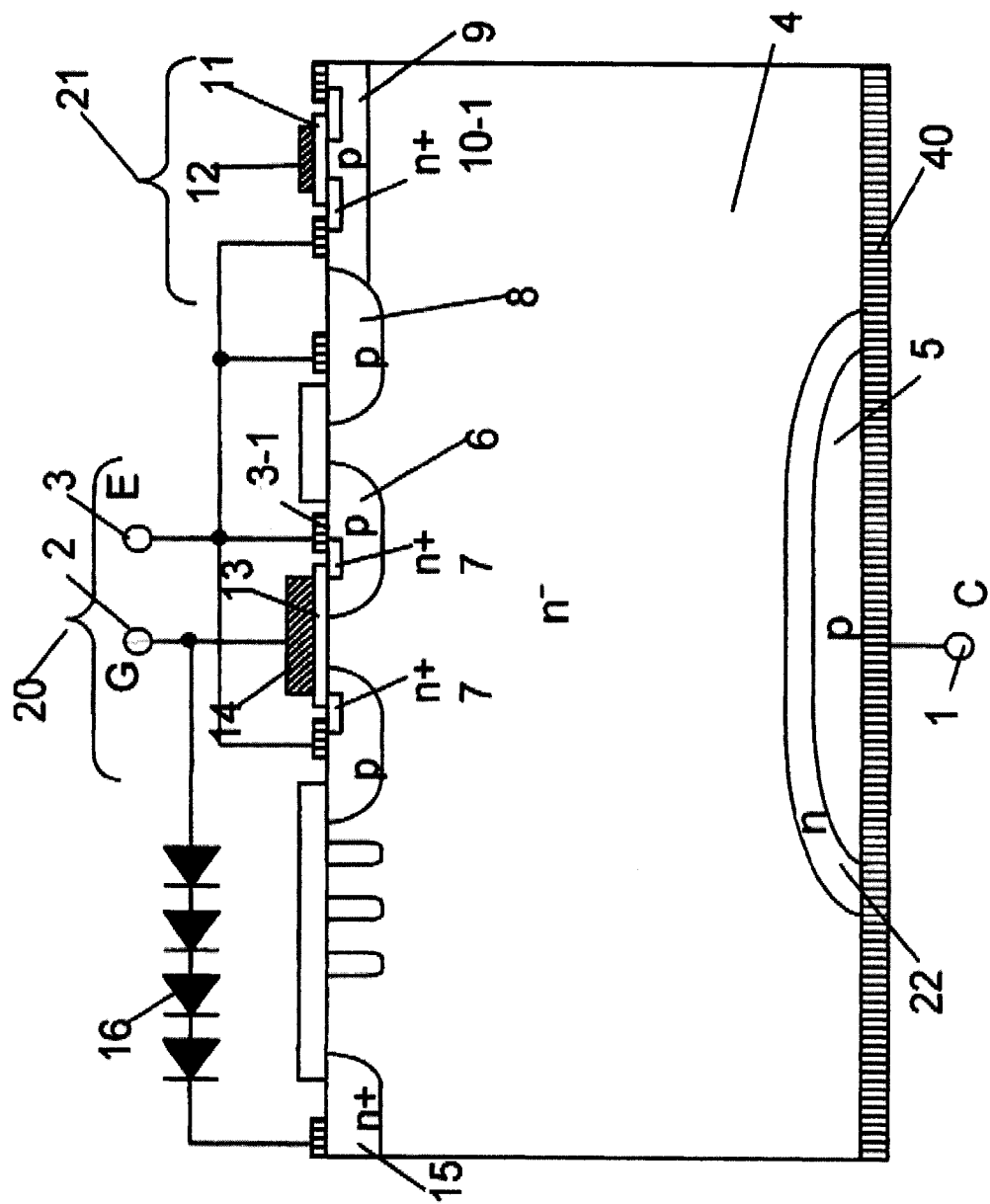
FIG. 2 schematically illustrates a sectional view of a second embodiment of an IGBT according to the present invention, showing relevant elements thereof.

Referring to FIG. 2, the second embodiment is similar to the first embodiment, except that the second embodiment additionally includes, to attain better characteristics than the IGBT according to the first embodiment, a high-concentration n-type buffer layer 22 having a higher impurity concentration than the drift (semiconductor substrate) 4 surrounding the p-type region 5 (collector region). Like the above-described field-stop (FS) IGBT structure, this structure can reduce the on-resistance by decreasing the thickness of the drift layer 4. In addition, the second embodiment can suppress leak current at a high temperature. A high-temperature leak current characteristic is important when the device is operated at 150° C. or more, such as in an automobile use. Therefore, particularly in IGBTs suitable in igniter circuits, using this structure for the purpose of suppressing leak current provides greater advantages than using it as a field-stop layer. If there is no particular reason for lowering the ON-voltage, the drift layer 4 can be set thicker than a value for an ordinary field-stop layer provided to lower the ON-voltage.

Figure 3:
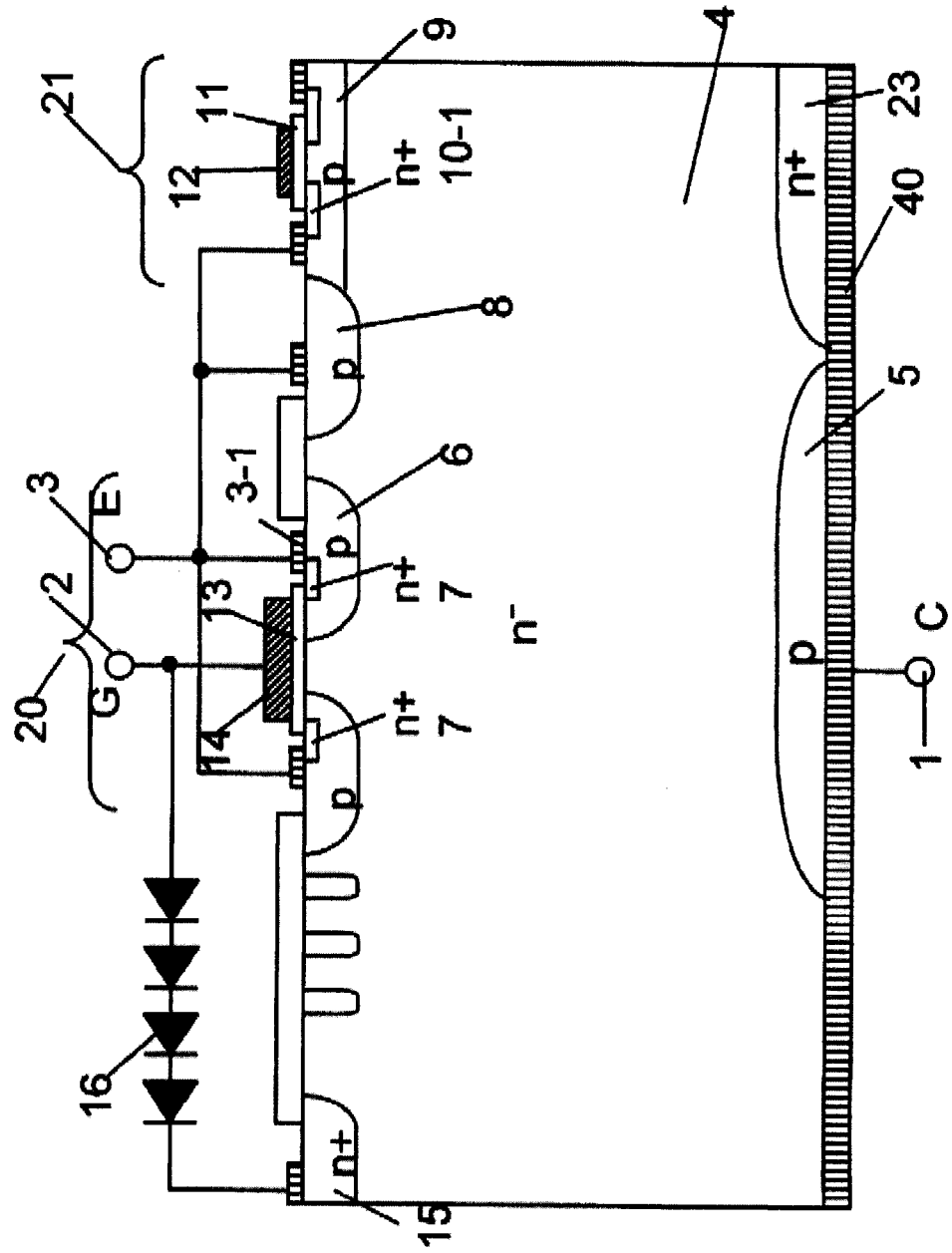
FIG. 3 schematically illustrates a sectional view of a third embodiment of an IGBT according to the present invention, showing relevant elements thereof.

Referring to FIG. 3, the third embodiment is similar to the first embodiment, except that the third embodiment includes a high-concentration $n^+$ region 23 formed on the back surface side right under the circuit section 21 and in ohmic contact with the collector-side metal electrode 40. The third embodiment provides the same basic advantages as the first embodiment. In addition, the height of the Schottky barrier between the metal electrode 40 and the $n^+$ region 23 can be very low, which allows even a metal such as Al to absorb a negative collector surge sufficiently.

Figure 4:
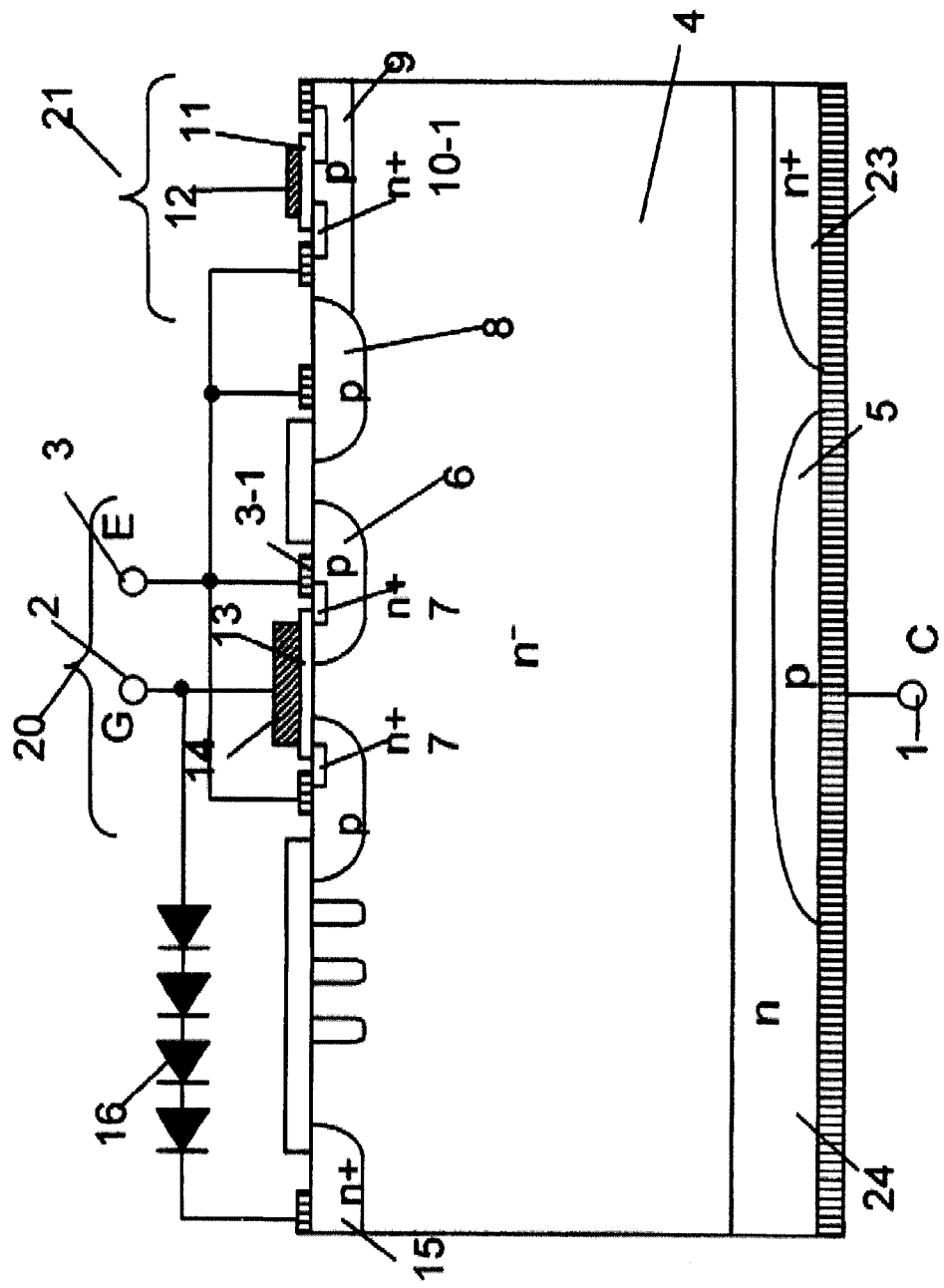
FIG. 4 schematically illustrates a sectional view of a third embodiment of an IGBT according to the present invention, showing relevant elements thereof.

Referring to FIG. 4, the fourth embodiment is a combination of the second and third embodiments. Here, an n-type buffer layer 24, extending deeper than the collector region 5 and the high-concentration region 23 is added to the configuration of FIG. 3. The fourth embodiment also can suppress leak current of the IGBT at a high temperature.

Referring to FIG. 5, the fifth embodiment is similar to the third embodiment except that the fifth embodiment includes another high-concentration $n^+$ region 23 formed right under the breakdown-resistant structure 39 provided around the IGBT active section 20. This structure can lower the height of the Schottky barrier. This can distribute surge current caused by a negative collector surge over a wide area. Even a higher surge absorbing ability can be obtained.

According to the first to fifth embodiments, when a negative collector bias is applied in the ON-to-OFF transition period, large current flows can be distributed over a wide area, preventing current concentration. The IGBT according to the present invention thus can be made less prone to damage.

While the IGBT is ON, the hole current flow is restricted so that more current can be directed to the IGBT active section 20, suppressing a latch-up operation of the control circuit section 21 due to a parasitic transistor. Therefore, the size of the IGBT can be reduced by shortening the distance between the IGBT active section 20 and the control circuit section 21.

The IGBT having a control circuit (overvoltage protection function) according to the present invention is useful because it can be used as various power switches, such as relay-replacement switches and switches used in automobile igniters in which a surge occurs repeatedly.

While the present invention has been particularly shown and described with reference to exemplary embodiments, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on and claims priority to Japanese Patent Application 2007-276453 filed on 24 Oct. 2007. The disclosure of the priority application in their entirety, including the drawings, claims, and the specification thereof, is incorporated herein by reference.

What is claimed is:

1. A semiconductor device comprising:
    a semiconductor substrate of a first-conductivity type having a one major surface and an opposite major surface opposite the one major surface;
    an IGBT section comprising:
    an active section on a side of the one major surface of the semiconductor substrate, including a gate electrode and an emitter electrode;
    a breakdown-resistant structure surrounding the active section;
    a collector region of a second-conductivity type on a side of the opposite major surface of the semiconductor substrate; and
    a collector electrode in contact with the opposite major surface of the semiconductor substrate;
    a first high-concentration region of the first-conductivity type in the one major surface of the semiconductor substrate, outside the breakdown-resistant structure, and higher in impurity concentration than the semiconductor substrate;
    a Zener diode connected to the high-concentration region and the gate electrode, with an anode of the Zener diode connected to the gate electrode;
    a control circuit section disposed inside the breakdown-resistant structure on the side of the one major surface of the semiconductor substrate; and
    a well region of the second-conductivity type in the one major surface of the semiconductor substrate and surrounding the control circuit section;
    wherein the well region connects to the emitter electrode of the IGBT section,
    wherein the control circuit protects the IGBT section by detecting an abnormal state of the IGBT section through the emitter electrode and controls a gate voltage of the IGBT section,
    wherein the collector region is in the opposite major surface of the semiconductor substrate positioned underneath the active section; and wherein the collector region is not positioned vertically underneath the control circuit section.

2. The semiconductor device according to claim 1, further comprising a buffer region of the first-conductivity type positioned between the collector region and the active region, and having a higher impurity concentration than the semiconductor substrate.

3. The semiconductor device according to claim 1, wherein a depth of the collector region is about 1 µm.

4. The semiconductor device according to claim 2, wherein a depth of the collector region is about 1 µm.

5. The semiconductor device having a control circuit according to claim 1, further comprising a second high-concentration region of the first-conductivity type adjacent to the collector region and having a higher impurity concentration than the semiconductor substrate.

6. The semiconductor device having a control circuit according to claim 2, further comprising a second high-concentration region of the first-conductivity type adjacent to the collector region and having a higher impurity concentration than the semiconductor substrate.

7. The semiconductor device having a control circuit according to claim 5, further comprising an intermediate-concentration layer of the first-conductivity type on the side of the opposite major surface extending deeper into the opposite major surface than the collector region and the second high-concentration region, wherein the intermediate-concentration layer has impurity concentration between those of the semiconductor substrate and the second high-concentration region.

8. The semiconductor device having a control circuit according to claim 5, wherein a depth of the collector region is about 1 µm.

9. The semiconductor device having a control circuit according to claim 6, wherein a depth of the collector region is about 1 µm.

10. The semiconductor device according to claim 1, wherein collector region extends also underneath the breakdown-resistant structure.

11. The semiconductor device according to claim 5, wherein the second high-concentration region is also positioned underneath the control circuit section.

12. The semiconductor device according to claim 6, wherein the second high-concentration region is also positioned underneath the control circuit section.

13. The semiconductor device according to claim 11, further comprising a third high-concentration region of the first-conductivity type adjacent to the collector region and positioned underneath the breakdown-resistant structure.

14. The semiconductor device according to claim 12, further comprising a third high-concentration region of the first-conductivity type adjacent to the collector region and positioned underneath the breakdown-resistant structure.

15. The semiconductor device according to claim 1, wherein the active section includes a base region of the second-conductivity type in the one major surface of the semiconductor substrate, an emitter region of the first-conductivity type in a surface region of the base region, with the emitter electrode in contact with both the emitter region and the base region, and with the gate electrode over a portion of the base region located between the emitter region and a portion of one major surface of the semiconductor substrate adjacent to the base region, with a gate insulating film interposed in between.

16. The semiconductor device according to claim 1, wherein a predetermined thickness of the semiconductor substrate ranges inclusive between 70-120 µm.

17. The semiconductor device according to claim 16, wherein the semiconductor substrate is an FZ or CZ substrate.

* * * * *